United States Patent [19]

Son

[11] Patent Number: 5,411,910
[45] Date of Patent: May 2, 1995

[54] METHOD FOR IMPROVING CHARACTERISTICS OF PARASITIC PN DIODES IN STATIC RANDOM ACCESS MEMORY CELL

[75] Inventor: Kwang S. Son, Seongnam, Rep. of Korea

[73] Assignee: Hyundai Electronics Industries Co., Ltd., Kyoungkido, Rep. of Korea

[21] Appl. No.: 114,203

[22] Filed: Aug. 30, 1993

[30] Foreign Application Priority Data

Sep. 3, 1992 [KR] Rep. of Korea ............... 1992-16042

[51] Int. Cl.$^6$ .................... H01L 21/70; H01L 27/00
[52] U.S. Cl. ........................... 437/52; 437/47; 437/60
[58] Field of Search ............. 437/191, 904, 162, 193, 437/46, 47, 52, 60, 918–919; 257/902–903, 927, 920, 379–381; 477/101

[56] References Cited

U.S. PATENT DOCUMENTS 4,890,144 12/1989 Teng et al. .......................... 257/66
5,170,227 12/1992 Kaneko et al. ...................... 257/67

*Primary Examiner*—Olik Chaudhuri
*Assistant Examiner*—H. Jey Tsai
*Attorney, Agent, or Firm*—Darby & Darby

[57] ABSTRACT

The present invention relates to a method for improving characteristics of parasitic pn diodes in a static random access memory using a PMOS TFT.

Disclosed herein is a method for improving characteristics of parasitic pn diodes which comprises the step of implanting impurities having a type opposite to that of impurities doped in a previously formed polysilicon layer in a contact area of the previously formed polysilicon layer.

3 Claims, 3 Drawing Sheets

METHOD FOR IMPROVING CHARACTERISTICS OF PARASITIC PN DIODES IN STATIC RANDOM ACCESS MEMORY CELL

BACKGROUND OF THE INVENTION

The present invention relates to a method for improving characteristics of parasitic pn diodes in a static random access memory cell (called hereinafter SRAM) using a thin-film-transistor (called hereinafter "TFT").

Generally, a process of manufacturing TFT in a SRAM comprises a step of forming two polysilicon layers or more which consist of a channel polysilicon layer forming channel and source/drain regions, and a gate polysilicon layer forming a gate electrode.

The top gate electrode is formed on the channel polysilicon layer and the bottom gate electrode is formed under the channel polysilicon layer.

However, forward and reverse parasitic pn diodes are formed between the channel polysilicon layer and the gate polysilicon layer.

A detailed description of parasitic pn diodes will be given below with reference to FIG. 1, FIG. 2A and FIG. 2B in which FIG. 1 is an equivalent circuit diagram of SRAM using PMOS TFT.

Referring to FIG. 1, two access transistors 1 and 2 and two driver transistors 3 and 4 are formed on a silicon substrate and two PMOS-TFT transistors 5 and 6 are formed by two polysilicon layers and a metal layer. Then, two forward parasitic pn diodes 7 and 8 and a reverse parasitic pn diode are formed in a SRAM cell.

A parasitic pn diode is formed when a p channel polysilicon layer is connected with a substrate or a polysilicon layer having many electrons such as a gate electrode of driver transistor, a n substrate, a gate polysilicon layer not a gate electrode but a pad, or the like.

Two forward parasitic pn diodes 7 and 8 appear when high voltage is applied to a channel polysilicon layer and low voltage is applied to a substrate or a polysilicon layer having many electrons. Also a reverse parasitic pn diode 9 appears when low voltage is applied to a channel polysilicon layer.

As shown in FIG. 1, an amount of electric current flowing to a high voltage node is determined by two PMOS-TFT's 5 and 6, the forward parasitic pn diodes 7 and 8 and the reverse parasitic pn diode 9. When a SRAM cell is operated, the amount of forward and reverse electric current through two parasitic pn diodes must be more large than an electric current of PMOS-TFT transistor in order to maintain a high voltage node stably. That is to say, it is desirable that an electric current of PMOS-TFT is not limited by two parasitic pn diodes.

Therefore, It is required to increase the amount of forward and reverse electric current though two parasitic pn diodes in the range of an operating voltage of TFT SRAM, particularly in a low voltage range (within 2 volt).

A conventional PMOS TFT and a metal contact will be described in detail with reference to FIG. 2.

Now referring to FIG. 2A, a conventional method forming contact between a metal layer and a TFT is to directly connect a thin channel polysilicon layer 13 with the metal layer 15. However, because the polysilicon layer 13 is made of very thin film, it may be perforated in the etching process for forming the contact hole. Accordingly, it is disadvantageous that the channel polysilicon layer 13 is only connected with a part of side surface of metal 15. Therefore, a contact between the metal layer 15 and the channel polysilicon layer 13 is unstable.

Also, in another conventional method forming contact between a metal layer and a TFT as shown in FIG. 2B, a gate polysilicon layer 11, not a gate electrode but a pad, is deposited on a first insulation film 10 and the channel polysilicon layer 13 and the metal layer 15 are connected with the gate polysilicon layer 11. In this structure, a direct bias current flows through the metal layer 15, the gate polysilicon layer 11 and the channel polysilicon layer 13. However, in this process for forming a contact between the metal layer 15 and the channel polysilicon layer 13 using the gate polysilicon layer 11, it is a problem that a reverse parasitic pn diode is formed.

SUMMARY OF THE INVENTION

Therefore, it is an object of the present invention to provide a method for improving characteristics of parasitic pn diodes in a SRAM cell.

A method for improving characteristics of parasitic pn diodes according to the present invention comprises the step of implanting impurities having a type opposite to that of impurities doped in a previously formed polysilicon layer in a contact area of the previously formed polysilicon layer.

BRIEF DESCRIPTION OF THE DRAWINGS

FIGS. 4A-4B illustrate a method of manufacturing PMOS TFT according to the present invention.

DETAILED DESCRIPTION OF THE INVENTION

A detailed description of an embodiment according to the present invention will be given below with reference to FIG. 3A to FIG. 6D.

Figure 1:
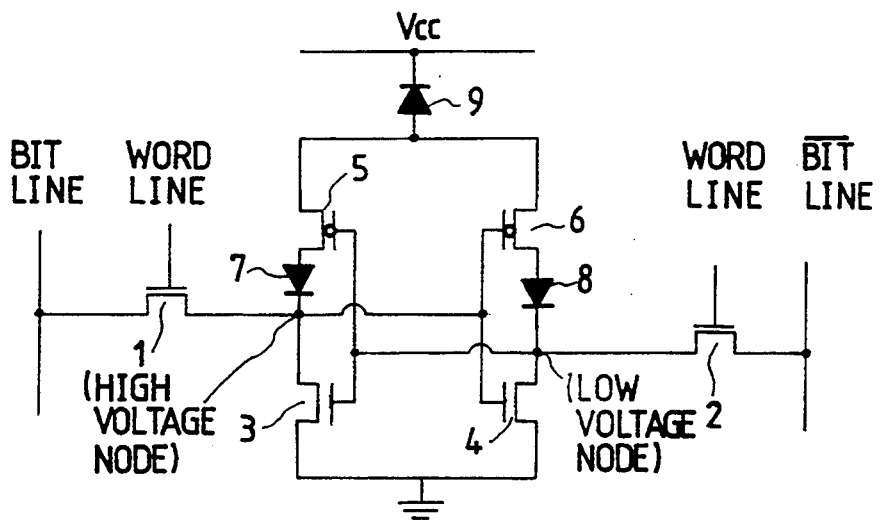
FIG. 1 is an equivalent circuit diagram of a SRAM using PMOS TFT.
Figure 2A:
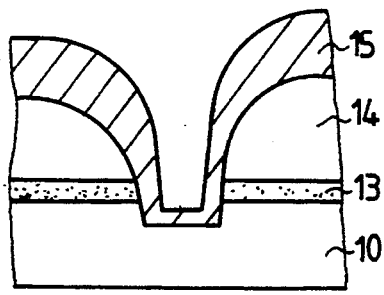
FIG. 2A and FIG. 2B are cross sectional views of conventional PMOS-TFT's.
Figure 2B:
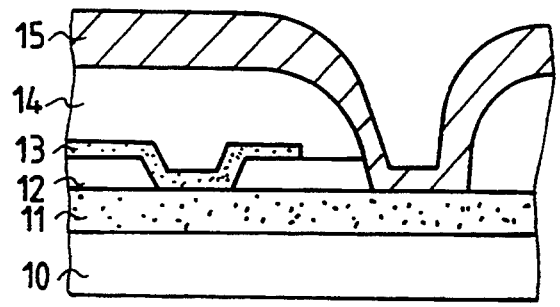
Figure 3A:
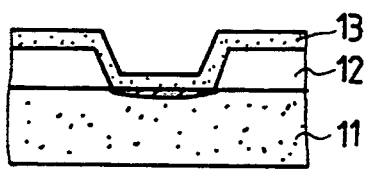
FIG. 3A and FIG. 3B are cross sectional views of a conventional PMOS-TFT and a PMOS-TFT according to the present invention respectively.
Figure 3B:
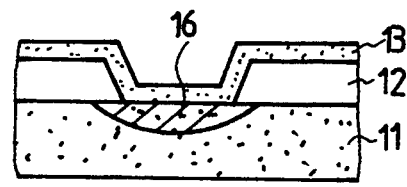

Referring to FIG. 3A, a channel polysilicon layer 13 is directly connected with a gate polysilicon layer 11 in conventional method. However, referring to FIG. 3B, according to the present invention, opposite type impurities are implanted in the gate polysilicon layer 11 in order to increase an pn junction area. Thereafter, the channel polysilicon layer 13 is connected with the gate polysilicon layer 11.

Figure 4A:
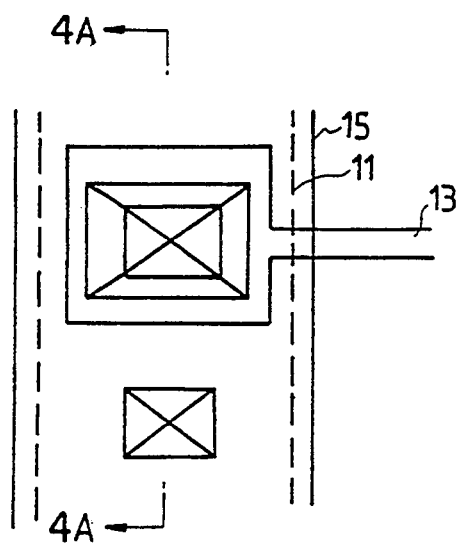
FIGS. 4A and 4B are plan views of a PMOS TFT according to the present invention.
Figure 4B:
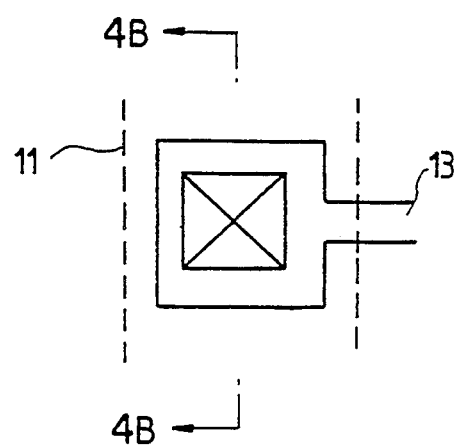

FIG. 4A and FIG. 4B are plan views of a PMOS TFT according to the present invention. The present invention will be described with reference to FIG. 5A to FIG. 5D and FIG. 6A to FIG. 6D taken along the line A-A' of FIG. 4A and the line B-B' of FIG. 4B respectively.

Figure 5A:
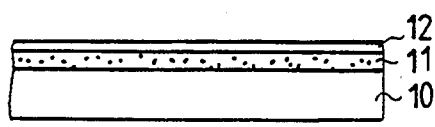
FIGS. 5A to 5D are cross sectional views taken along the line A-A' of FIG. 4A.
Figure 6A:
FIGS. 6A to 6D are cross sectional views taken along the line B-B' of FIG. 4B.

First, referring to FIG. 5A and FIG. 6A, the gate polysilion layer 11 is deposited on a first insulation film 10 and impurities are implanted in the gate polysilicon layer 11. Then, the gate polysilicon layer 11 is etched and a gate oxide layer 12 is deposited on the gate polysilicon layer 11. Also, said gate oxide layer 12 can be grown in the gate polysilicon layer 11.

Figure 5B:
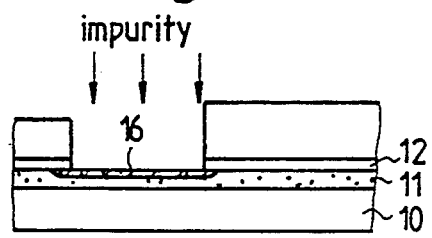
Figure 6B:
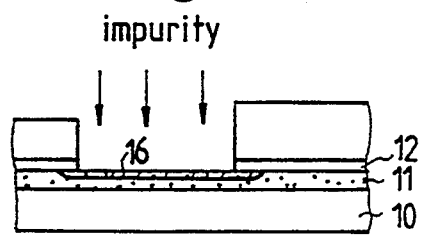

Next, referring to FIG. 5B and FIG. 6B, a photoresist is covered on the gate oxide layer 12. Then, the gate oxide layer 12 is etched by a mask pattern process and the opposite type impurity is implanted in an exposed gate polysilicon layer 11.

So, an opposite type ion implanting part 16 is formed in the exposed gate polysilicon layer 11.

Figure 5C:
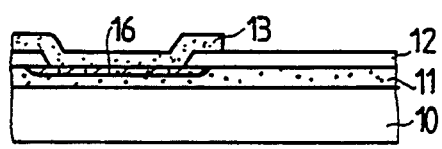
Figure 6C:
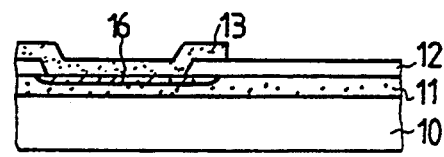

Next, referring to FIG. 5C and FIG. 6C, the channel polysilicon layer 13 is deposited on the opposite type ion implanting part 16 and then annealing process of the channel polysilicon layer 13 is performed. Then, in order to adjust a threshold voltage of TFT and to form a source/drain area of TFT, implanting processes of impurities are performed and then the channel polysilicon layer 13 is etched in an intended size.

Figure 5D:
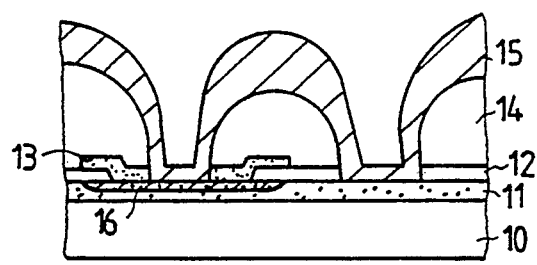
Figure 6D:
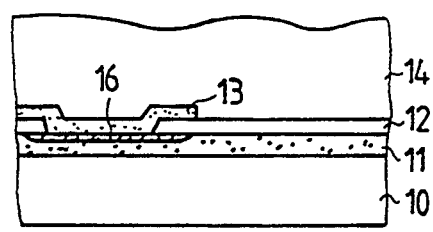

Next, referring to FIG. 5D and FIG. 6D, a loading oxide layer and the 2nd insulation film 14 and a photoresist are covered on the entire structure, respectively.

The 2nd insulation film 14 is etched by mask pattern process, so, a contact hole is formed in order to connect the gate polysilicon layer 11 with the metal 15, and then the metal 15 is deposited on the contact hole as shown with FIG. 5D.

On the other hand, the channel polysilicon layer 13 can remain between the gate polysilicon layer 11 and the metal layer 15. The present invention can be used in a bottom gate process in a TFT as well as a semiconductor process forming pn junction.

Also, The present invention improve the characteristic of PMOS TFT by increasing an amount of electric current through a forward and reverse parasitic pn diode.

What is claimed is:

1. A method of improving characteristics of parasitic pn diodes formed in an SRAM, comprising the steps of:
    forming a gate polysilicon layer into which ion impurities are introduced, said gate polysilicon layer connecting a PMOS transistor to an NMOS transistor and metal wire;
    forming an insulating layer on said gate polysilicon layer;
    forming an opening portion in said insulating layer;
    implanting impurities having a conductivity type opposite to that of said gate polysilicon layer in said opening;
    forming a channel polysilicon layer of said PMOS transistor on said insulating layer including in said opening region; and
    annealing said gate polysilicon layer.

2. A method as claimed in claim 1, wherein said PMOS transistor is a thin film transistor having a source and drain in portions of said channel polysilicon layer.

3. A method as claimed in claim 1, wherein the step of implanting forms a pn junction between the gate polysilicon layer and the channel polysilicon layer that is of an area greater than would arise where all the previously mentioned steps except for the step of implanting are carried out such that the gate polysilicon layer and the channel polysilicon layer are directly connected.

* * * * *